United States Patent [19]

Outram

[11] 4,131,890
[45] Dec. 26, 1978

[54] SPECTRAL ANALYSIS

[75] Inventor: John D. Outram, Titchfield, England

[73] Assignee: Plessey Handel und Investments AG, Zug, Switzerland

[21] Appl. No.: 785,695

[22] Filed: Apr. 7, 1977

[30] Foreign Application Priority Data

Apr. 8, 1976 [GB] United Kingdom .............. 14268/76

[51] Int. Cl.² .......................................... G01R 23/02
[52] U.S. Cl. ............................. 343/108 M; 324/77 G
[58] Field of Search ................. 343/108 M; 324/77 G

[56] References Cited

U.S. PATENT DOCUMENTS

3,120,000  1/1964  Wilmotte ...................... 324/77 G X
3,961,172  6/1976  Hutcheon ..................... 324/77 G X Primary Examiner—Maynard R. Wilbur
Assistant Examiner—Richard E. Berger
Attorney, Agent, or Firm—Fleit & Jacobson

[57] ABSTRACT

An improved method of spectral analysis suitable for use in microwave landing systems comprising sampling an unknown signal whereby nulls associated with a Sin x/x distribution are identified to facilitate the identification of a wanted signal.

6 Claims, 10 Drawing Figures

SPECTRAL ANALYSIS

DISCLOSURE

This invention relates to spectral analysis and more especially but not exclusively it relates to frequency identification systems for use in doppler microwave landing systems.

According to the present invention a method of frequency identification comprises mixing an unknown frequency signal with first and second quadrature related functions of a known frequency signal alternately for a predetermined period, storing a plurality of samples taken over the whole of the period of the product of the unknown frequency signal and the first function of the known frequency signal, storing a plurality of samples taken over the whole of the period of the product of the unknown frequency signal and the second function of the known signal, and processing the samples to solve the equation:

$$G(f_1) = \frac{aT}{2}\left(\frac{e^{j(\theta-\frac{\pi}{2})}\sin \pi T(fo-f1)}{\pi T(fo-f1)} + \frac{e^{-j(\theta-\frac{\pi}{2})}\sin \pi T(fo+f1)}{\pi T(fo+f1)}\right)$$

where fo is the frequency of the unknown signal f1 is the frequency of the known signal T is the said predetermined period and a is the amplitude of fo at T/2.

Some exemplary embodiments of the invention will now be described with reference to the accompanying drawings in which.

Microwave landing systems with which this invention is especially concerned are systems in which signals transmitted from the ground are received by an aircraft and processed to provide an indication of the angles of elevation and azimuth of the aircraft with respect to a point on the runway. Guidance information received by an airborne receiving system is sometimes corrupted by a multi-path information (unwanted) imposing itself on the direct path information (wanted).

Figure 1:
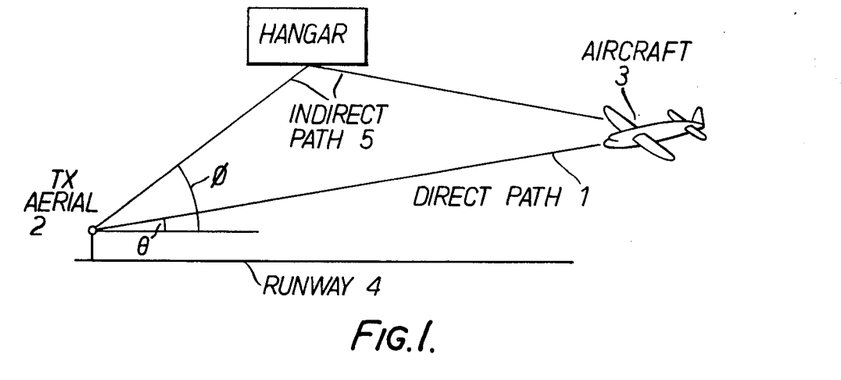
FIG. 1 is a generally schematic diagram showing the origin of a multi-path reflection in relation to an aircraft.

As shown in FIG. 1 a direct path signal 1 from a transmitter aerial 2 to an aircraft 3 is at an angle $\theta$ to the runway 4 whereas the aircraft also receives via an indirect path 5 a signal transmitted at an angle $\phi$ with respect to the runway 4. In FIG. 1 a single multi-path signal is shown but clearly if several large buildings are close to the transmitter then several different multi-path situations may exist which can give rise to erroneous elevation and/or azimuth readings in the aircraft.

There are essentially two forms of microwave landing system to consider. The first in which a narrow beam is swept through space provides guidance to the aircraft on the basis of the time elapsed between reception of an omni-radiated reference pulse and the swept beam. The second system, the so-called doppler microwave landing system, works by simulating the movement of a radiating source along the ground in the azimuth case or by simulating the movement of a radiating source in the vertical plane in the elevation case. This simulated movement is achieved by switching a signal from element to element of an array so that the point of radiation is scanned along the array. There are two arrays provided one for the elevation signal and one for the azimuth signal and in each case a reference signal is transmitted and doppler shift of the scanned signal with respect to the reference signal is detected by the aircraft in order to provide an indication of the angles of elevation and azimuth. Thus it will be appreciated that an R.F. signal received at the aircraft from the scanned array exhibits a doppler shift with respect to the reference signal proportional to the rate of movement in wavelengths of the source towards the aircraft. Swept beam system and the doppler microwave landing system exhibit a similar basic performance and the width of the main lobe of the detected signal depends basically on antenna length. In the doppler microwave landing system, antenna length governs how long the simulated moving source can move in a given direction before radical change must occur given a fixed rate of movement.

Figure 2:
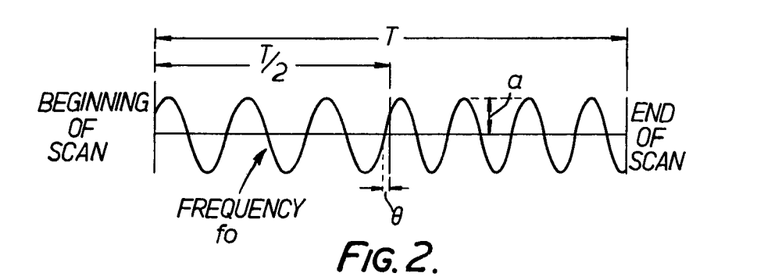
FIG. 2 is a waveform diagram showing the signal transmitted from a scanned array used in a doppler microwave landing system.

Referring now to FIG. 2 a waveform is shown of a signal transmitted from the scanned array which obtains for a period of time T. A Fourier analysis of the signal waveform yields:

$$G(f_1) = \frac{aT}{2}\left(\frac{e^{j(\theta-\frac{\pi}{2})}\sin \pi T(fo-f1)}{\pi T(fo-f1)} + \frac{e^{-j(\theta-\frac{\pi}{2})}\sin \pi T(fo+f1)}{\pi T(fo+f1)}\right)$$

Figure 3:
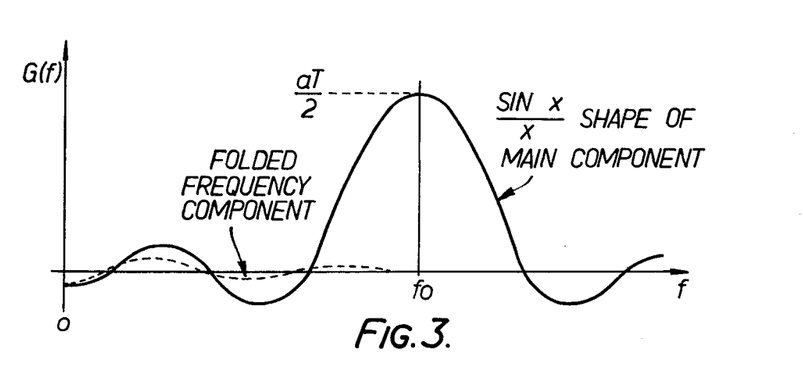
FIG. 3 is a waveform diagram showing the spectral distribution of the waveform shown in FIG. 2.

These are (Sin x)/x terms in which $x = \pi T(fo \pm f1)$ at fo and also at −fo and as shown in FIG. 3 at T/2 the amplitude is a. Since −fo is a negative frequency and does not for our purposes exist we need worry only about the components of this term which lie in the positive half of the frequency plane which will be called the folded frequency components. Hence the composite signal in the positive frequency plane looks as shown in FIG. 3 for $\theta = \pi/2$. From the above expression for G(f1) it is clear that both main and folded frequency components are periodic along the frequency axis and that the distances between nulls for either signal is 1/T except in the main lobe. Doppler microwave landing systems decoders operate on this base band signal whose signal spectrum distribution is of the form (Sin x)/x shown in FIG. 3. The problem is to identify and measure fo.

Various techniques are known for measuring fo and they generally afford protection against multipath effect by filtering. All known systems measure a single parameter of the input signal and any corruption of the parameter measured which may for instance be the frequency at which the peak of the spectrum occurs results in corruption of the output and in such systems there is often no indication that corruption is present.

A method according to one embodiment of the present invention of deriving fo unambiguously involves driving a set of samples of the function G(f1) as shown by the above equation by digitally correlating the received input signal against a locally generated signal which is chosen to be of approximately the right order of frequency and processing the samples to solve the equation as set forth above for fo. One manner in which the foregoing method may be put into effect will now be described with reference to FIGS. 4 through 9 of the drawings.

The signal transmitted from the transmitter array comprises a reference signal at 5GHz the scanned signal being offset from the reference signal by 83.2KHz, nominal. The actual frequency of the scanned signal with respect to the reference is dependent upon doppler shift and the doppler shift is dependent upon transmission angle. In practice a 30° transmission angle is equivalent to a doppler shift of 21.67KHz for the elevation case. Since scanning is effected in both directions the doppler shift for 30° is 82.2Khz ± 21.67KHz. Since doppler shift is a measure of the angle $\theta$ as shown in FIG. 1 the main purpose of the method hereinafter described is to determine the precise frequency of the doppler shift. In addition to the foregoing signals which basically comprise the reference signal and the scanned signal there are also transmitted at a frequency of 5GHz + 41.6KHz data signals which are utilised to identify the input signal received. The data signals identify whether the input signal relates to elevation or azimuth, elevation and azimuth signals being transmitted alternately.

Figure 4:
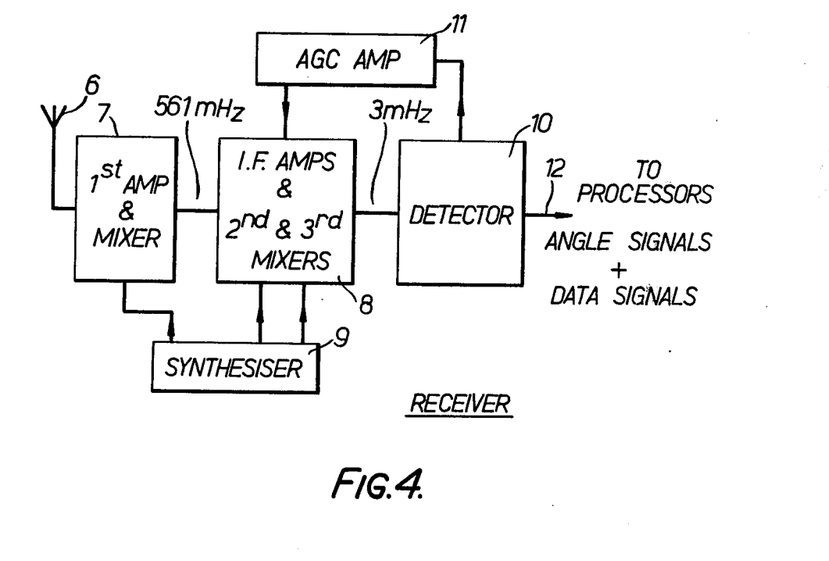
FIG. 4 is a generally schematic block diagram of a receiver of a doppler microwave landing system.

The input signals as just before described are fed to a receiver as shown in FIG. 4 comprising an aerial 6 feeding a first amplifier and mixer 7. The amplifier/mixer 7 feeds second and third mixers and I.F. amplifiers 8 the mixers 7, 8 being fed with local oscillator signals from a synthesiser 9. The output frequency from the first mixer is 561 MHz and the output from the second and third mixers is 3 MHz which is fed to a detector 10. An output from the detector 10 is fed to an AGC amplifier 11 which is utilised to provide an automatic gain control function for the I.F. amplifiers included within the block 8. An output signal from the detector 10 is fed on line 12 to a processor as shown in FIG. 6.

Figure 5:
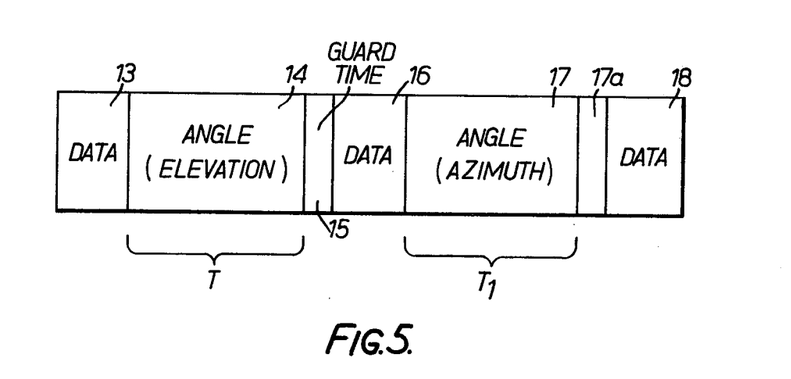
FIG. 5 is a generally schematic diagram showing the make-up of signals transmitted in a doppler microwave landing system.

The incoming signal is shown schematically in FIG. 5 and comprises data information 13 followed by a signal 14 of time T which comprises angle information relating to elevation there follows then a guard time 15 used for processor resetting. The cycle is then repeated with data 16 angle information 17 this time relating to azimuth, a guard time 17a and further data 18. As has already been described the signals which are transmitted for the time T relating either to angle elevation information or azimuth angle information comprise a signal at approximately 5 GHz which must be unambiguously measured so that the doppler shift can be determined. In practice the time T is about 1.2 milliseconds.

Figure 6:
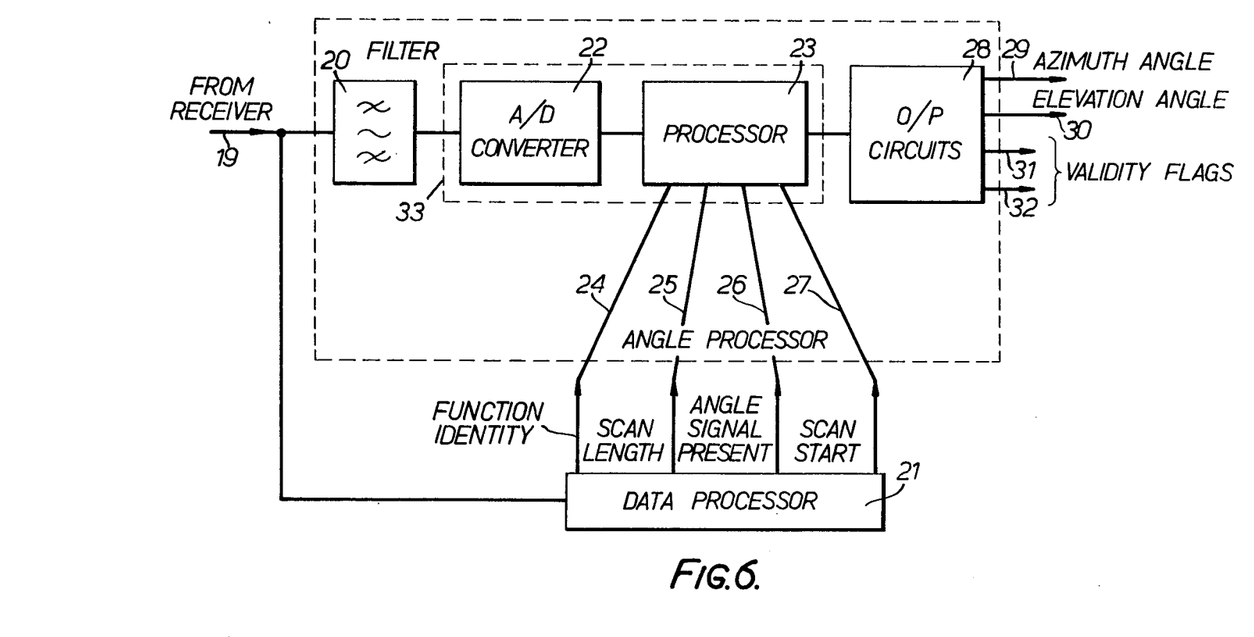
FIG. 6 is a generally schematic block diagram of apparatus including a processor for processing signals received by a receiver of the kind shown in FIG. 4.

Referring now to FIG. 6 the signals from line 12 as shown in FIG. 5 are fed to line 19 which feeds a filter 20 and a data processor 21. The filter 20 which is a bandpass filter feeds an analogue to digital converter 22 which in turn feeds a processor 23. Signals from the data processor 21 are fed to the processor 23 on lines 24, 25, 26 and 27 which relate to function identity, scan length, angle signal present and scan start respectively. Thus the data processor identifies the particular function of the signals applied to the filter i.e. elevation angle signals or azimuth angle signals as the case may be. The data processor indicates also the start and finish of the scan and when a signal relating to angle is present. Signals from the processor 23 are fed to output circuits 28 from which signals indicating the azimuth angle, the elevation angle and validity flags are provided. The validity flags are signals which are provided to indicate the validity of the azimuth and elevation angle signals. The azimuth angle signal, the elevation angle signal and the validity flags are fed from the output circuits on line 29, 30, 31, and 32 respectively. The A-D converter 22 and processor 23 which are shown within the broken line 33 will now be described in greater detail with reference to FIGS. 7, 8 and 9.

Figure 7:
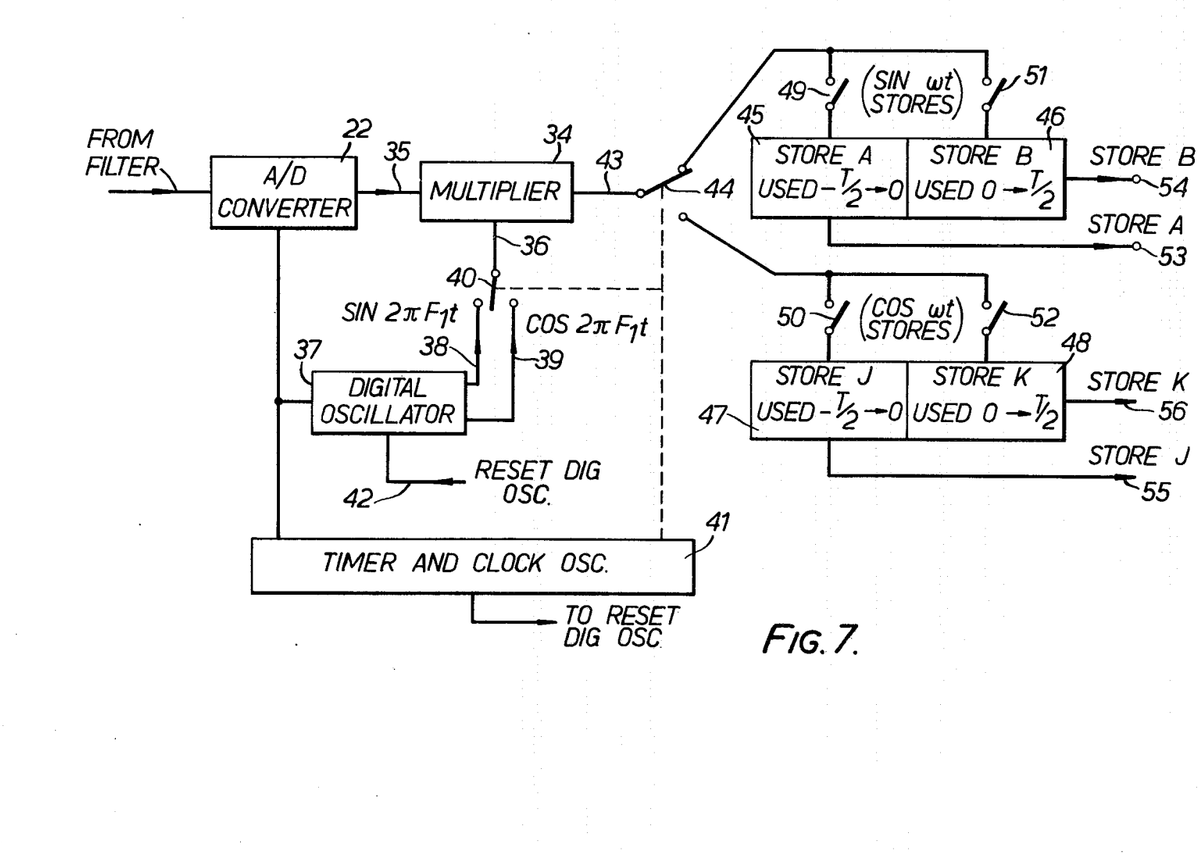
FIG. 7 is a block diagram of part of the processor shown in FIG. 6.

Referring now to FIG. 7 a signal from the filter 20 is fed to the A-D converter 22 which feeds a multiplier 34 thus a signal on line 35 fed to the multiplier 34 is a digital signal in binary form corresponding to the beat frequency between the reference frequency transmitted and the scanned frequency. The multiplier 34 is fed also via a line 36 from a digital oscillator 37 with a frequency f1 sine and cosine functions of f1 being provided on lines 38 and 39 respectively these two quadrature related signals being selected by means of a switch 40 and fed via the line 36 to the multiplier 34. The digital oscillator may be of any known kind providing angle data in binary form from a suitable store such as a ROM for example. The digital oscillator is controlled by means of a timer and clock oscillator 41 and by means of a signal fed to the digital oscillator on line 42. The output of the oscillator on line 43 is fed via a switch 44 to digital stores 45, 46, 47 and 48. The switches 40 and 44 are ganged under the control of the timer and clock oscillator 41 so that when the input signal on line 35 is mixed with the sine function, the resultant signal on line 43 is fed into the stores 45 or 46 and when the input signal on line 35 is mixed with the cos function on line 39 the resultant signal on line 43 is fed into the stores 47 and 48. The stores 45 and 47 are arranged by means of switches 49 and 50 operated under control of the clock 41 to be effective during the first half of each scan and the stores 46 and 48 are arranged to be effective during the second half of each scan by appropriate operation of switches 51 and 52. Thus it will be appreciated that during the first half of each scan the switches 49 and 50 only are closed whereas during the second half of each scan the switches 51 and 52 only are closed whereby the result of mixing the input signal with sine and cosine functions are separately integrated during the first and second halves of the scan. Thus as hereinbefore defined the scan time is equal to T and thus store 45 is used for the sine function between the period −(T/2) to 0 and store 46 is used for the sine function between the period 0 to (T/2), store 47 being used for the cos function between −(T/2) to 0 and store 48 being used for the cos function during the period between 0 and T/2.

The frequency f1 originally set into the digital oscillator 37 is originally chosen to be of the right order and as a result of operations which will hereinafter be described, by utilising the stored value of the signals in the stores 45, 46, 47 and 48 after each scan, the frequency fed from the digital oscillator is updated and this updating is effected by means of the signal applied to the digital oscillator via the line 42.

Figure 8:
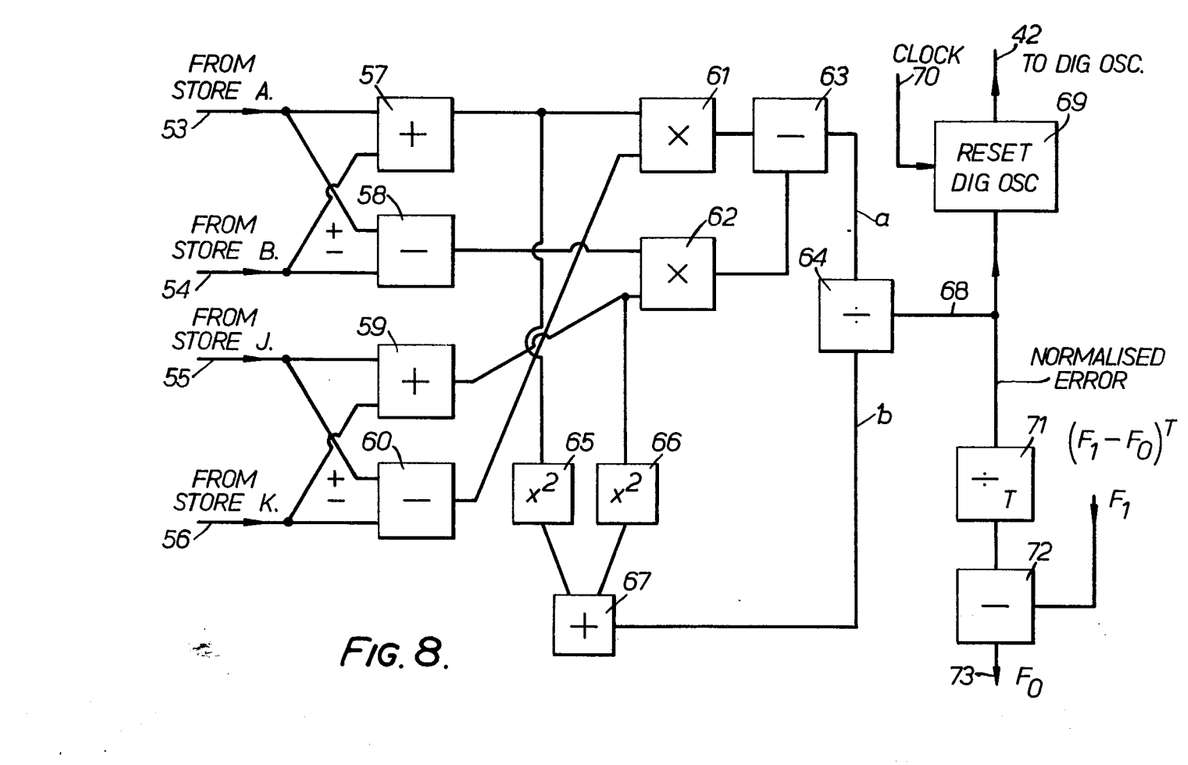
FIG. 8 is a block diagram of further parts of the processor shown partly in in FIG. 7.

The origin and derivation of the signal on line 42 will now be described with reference to FIG. 8. Output signals are fed from the stores 45, 46, 47 and 48 on lines 53, 54, 55 and 56 respectively. The sum of the signals on lines 53 and 54 is derived in summation device 57 and the difference of the signals on line 53 and 54 is determined by a subtraction device 58. In the same way the sum of the signals on lines 55 and 56 is determined by a summation device 59 and the difference between the signals on the lines 55 and 56 is determined by a subtraction device 60. Output signals from the subtraction device 60 and the summation device 57 are fed to a multiplier 61 and output signals from the subtraction device 58 and the summation device 59 are fed to a multiplier 62. Output signals from the multiplier 61 and 62 are fed to a subtraction device 63 an output signal from which is fed to a division circuit 64. Output signals from the summation devices 57 and 59 are fed also through squarers 65 and 66 the outputs from which are added in an adder 67 which also feeds the division circuit 64. The output from the division circuit on line 68 is in effect the normalised error i.e. (f1 − f2)T and this can be seen as a significant part of the equation which represents the function G(f1). The signal is fed via a resetting gate and amplifier 69, under control of the clock signal applied thereto on line 70, to line 42 for the purpose of resetting the digital oscillator. Now the normalised error signal on line 68 is also fed to a further division circuit 71 which divides by T and the output from this circuit is fed to a subtraction device 72 which subtracts the frequency (f1) which is derived from the digital oscillator to leave on line 73 the output signal representing fo which is the unknown signal required. It will be appreciated however that since the frequency f1 from the digital oscillator is updated after each scan by the signal on line 42, that several scans worth of data may be required before the output signal is set correctly to correspond with fo.

Figure 9:
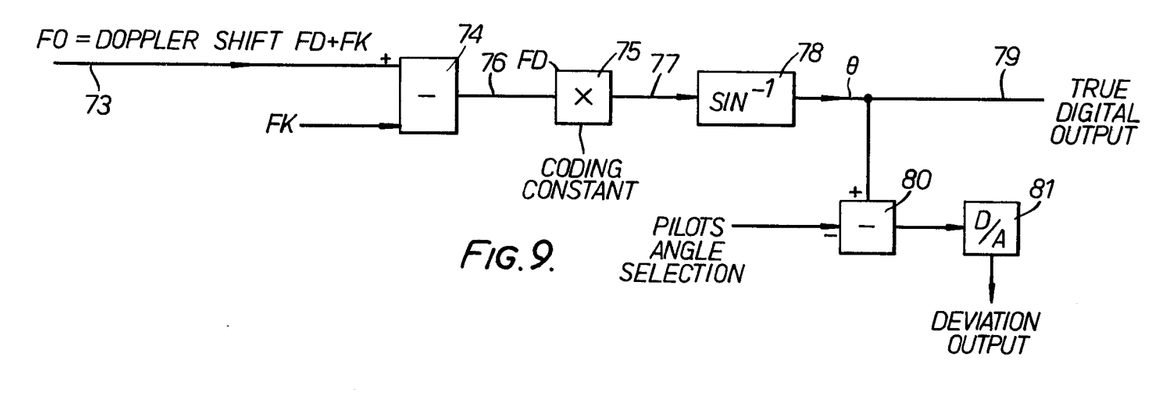
FIG. 9 is a block diagram showing a part of the output circuits shown in FIG. 6.

Turning now to FIG. 9 the signal representing fo on line 73 is fed to a further subtraction circuit wherein a frequency constant FK is subtracted. In the present example the frequency constant corresponds to the frequency 83.2 KHz which is the difference between the scan frequency and the reference frequency. This subtraction exercise is carried out in subtraction device 74, the output from which is fed to a multiplier 75 which multiplies the doppler shifted frequency fD fed thereto on line 76 by a coding constant. The output signal from the multiplier 75 is then fed on line 77 to a sine$^{-1}$ device 78 from which a true digital output signal representative of frequency is derived on line 79. The signal is then processed according to the particular display required and fed to a subtractor 80 in the present case which is fed with wanted angle data so that a deviation signal output may be provided from a digital-to-analogue converter 81 fed from the subtraction circuit 80.

The foregoing description is concerned with apparatus for deriving the frequency fo utilising a single frequency f1 provided by the digital oscillator 37 by taking a plurality of samples during each period T/2 which are stored as appropriate. After each scan the frequency used by the digital oscillator 37 is updated in accordance with the signal provided on the line 42 which is determined in dependence upon the normalised error on line 68. In one embodiment 336 samples are taken altogether during each scan time T which is 1.2 milliseconds approximately each sample occupying approximately 3.5 microseconds. In the foregoing example sine and cosine related samples are taken alternately during both the first and second halves of each scan. It should be understood however that an arrangement for treating the scan in two halves is described herein by way of example only and to simplify the description. In practice the scan may not be split or it may be split into quarters or any convenient smaller fraction. Moreover the use of a single frequency f1 is the simplest case.

In an alternative arrangement however two frequencies f1 and f2 may be utilised the frequency f2 being treated in the same way as f1 was treated utilising sine and cosine signals in respect of f2 to produce stored samples appertaining to f2. In such an arrangement frequencies f1 and f2 would be sampled alternately in respect of their sine and cosine functions. In this way data appertaining to two equations may be collected one appertaining to the function G(f1) and the other appertaining to the function G(f2) and thus two equations may be produced and a simultaneous equation solved for fo the unknown frequency and also for a the amplitude. By this means an unambiguous result is more certainly achieved and fo may be resolved even when the frequencies chosen are more than a wavelength away from the wanted frequency fo. The hardware for solving this simultaneous equation is not described herein but it will be appreciated that such an exercise may be performed by those skilled in the art. In practice the hardware described hereinbefore for solving the equation in respect of f1 may be performed by a microprocessor and if two frequencies were utilised the microprocessor could equally well be used to provide the result. From the foregoing explanation it will be understood that by special choosing of the frequency or frequencies provided by the digital oscillator 37 a single component forming the input signal can be identified. All the coherent signals present in the received input signal can be considered to produce components similar to G(f1) which by the rules of Fourier analysis add to produce a complex composite spectrum and various values for fo depending in each case on the position of reflecting objects etc. providing the multipath interference. Considering that a single unwanted signal is present the unwanted signal because it is of the form (Sin x)/x the same as the wanted signal has nulls in its amplitude spectrum which are periodic in 1/T. By utilising the hardware as just before described in effect of the nulls in the unwanted signal, in the frequency domain as opposed to the time domain are identified so that the wanted signal is identified simply and accurately.

If the simple assumption is made that the patterns of the side lobes from multi-path signals with run through the main lobe of the wanted signal each approximates a sine wave of period 2/T then the resultant unwanted signal can also be described as a single sine wave of amplitude unknown of period 2/T. It should be noted that the folded frequency components of the various signals can be incorporated into this resultant sine wave. By taking three samples a1, a2 and a3 of the total function G(f) which includes the wanted signal at intervals separated by 1/T it is possible and fairly simple to calculate the two parameters which identify the wanted signal which is credited with the shape sine (x/x) and also to calculate the amplitude of the sine wave component.

Figure 10:
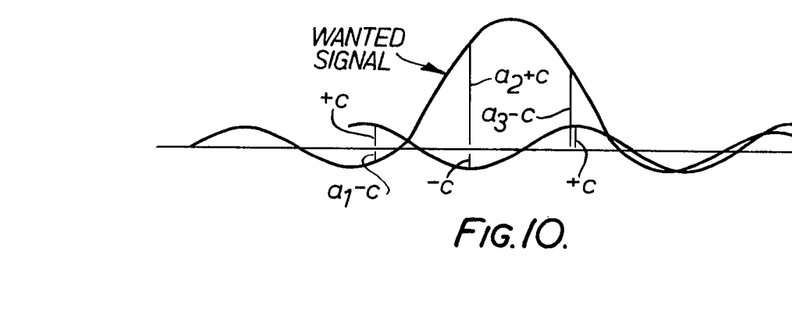
FIG. 10 is a waveform diagram showing the spectral distribution of a wanted signal in the presence of an unwanted signal.

Referring now to FIG. 10, if C is the amplitude of the sine wave a1, a2, a3 are the total sample amplitudes thus a1 − C is the amplitude of the (Sin x)/x shape. If a second set of samples are taken which give the amplitude of the sine wave at some point say mid-way between f1 and f2 then the approximate position of the nulls in the sine waves may be calculated for instance with an arctan function in a microprocessor. A further set of samples perhaps obtained from another scan-worth of input information could be arranged to sit in the nulls of the sine wave and hence by an iterative process there can be obtained measurements of the wanted signal which are uncorrupted by interference and in fact the only limitations from this is that the composite unwanted signal should have nulls periodic in 1/T. When the sample frequencies are sighted in these nulls it does not matter that the sine wave assumption is only approximate.

If the main lobe of the unwanted signal lies inside the main lobe of the wanted signal then to meet the above requirement only one of the samples can lie inside the wanted main lobe instead of two as would be the optimum case.

It is therefore apparent that the sampling must be sufficient to identify nulls in the unwanted signal so as to facilitate accurate measurement of the wanted signal.

Clearly the approach may be extending for instance by assuming two (Sin x)/x distributions in a single sine wave which would require at least five samples for the identification instead of the three just before mentioned the computation becomes more complex however and may not be justified in practical situations.

Various modifications to the system just before described may be applied without departing from the scope of the invention.

The frequency measurement is achieved as just before described by correlating a digitally generated local oscillator with the input signal.

In normal operation, the digitally generated local oscillator tracks to the input signal frequency. To a limited extent, signals other than the wanted one (e.g. multipath signals) may still confuse the situation, and a better measurement of the wanted signal may sometimes be afforded by offsetting the local oscillator frequency from the apparent input signal frequency. There are several choices as to the best "offset law" to use, and, as well as using "unwanted signals present" as an indication of optimum measurement position, the likelihood of unwanted signals being present may also be included so as to give further protection. The latter, for instance, is strongly related to angular position, and specifically the unwanted signals in an elevation system are likely to occur below (in angular terms) the wanted signal position.

The Doppler system to which the invention relates more especially is amenable to 'array taper' actually applied in the airborne receiver. Taper may be either amplitude or phase, or both. Such tapers affect the spectrum of the input signal, and consequently the nulls of unwanted signal spectra may be moved around at will, as prescribed by the transform of the taper function.

Since taper may be applied 'off-line' in the receiver, it may be possible to make it automatically adaptive, and so bring further benefit to the system.

What we claim is:

1. A method of frequency identification comprising mixing an unknown frequency signal with first and second quadrature related functions of a known frequency signal alternately for a predetermined period, storing a plurality of samples taken over the whole of the period of the product of the unknown frequency signal and the first function of the known frequency signal, storing a plurality of samples taken over the whole of the period of the product of the unknown frequency signal and the second function of the known signal and processing the samples to solve the equation:

$$G(f_1) = \frac{aT}{2} \left( \frac{e^{j(\theta - \frac{\pi}{2})} \sin \pi T(f_0 - f_1)}{\pi T (f_0 - f_1)} + \frac{e^{-j(\theta - \frac{\pi}{2})} \sin \pi T(f_0 + f_1)}{\pi T (f_0 + f_1)} \right)$$

where $f_0$ is the frequency unknown signal, $f_1$ is the frequency of the known signal, T is the said predetermined period and a is the amplitude of $f_0$ at $T/2$.

2. Apparatus for carrying out the method according to claim 1 for identifying the frequency of an unknown signal present for a predetermined period comprises an analogue-to-digital converter to which the unknown signal is fed, a multiplicative digital mixer fed from the analogue-to-digital converter, a digital oscillator arranged to feed the said mixer alternately with digital sine and cosine function signals respectively derived from a known frequency signal, first digital storage means to which a resultant digital signal constituting the product of the sine function of the known signal and the unknown signal is fed, second digital storage means to which a resultant digital signal constituting the product of the cosine function of the known signal and the unknown signal is fed and a microprocessor responsive to the digital signals in the stores for providing an output signal indicative of the frequency of the unknown signal.

3. Apparatus as claimed in claim 2 wherein the first and second digital storage means each comprises a plurality of compartments operative for storage purposes each for a predetermined part of the said predetermined period the microprocessor being responsive to the digital signals stored in the compartments for providing the said output signal.

4. Apparatus as claimed in claim 3 wherein sine and cosine functions of a plurality of different frequencies are provided by the digital oscillator and mixed sequentially with the unknown signal, samples being taken sequentially and stored in storage means which are sampled by the microprocessor for providing the said output signal.

5. Apparatus as claimed in claim 4 wherein an output signal from the microprocessor is fed back to the digital oscillator and utilised to update the signals produced by the oscillator whereby an output error signal from the microprocessor is constrained to tend to zero.

6. Apparatus as claimed in claim 5 in combination with a receiver for receiving Doppler microwave landing signal transmissions.

* * * * *